US010921412B2

(12) United States Patent
Wenzel et al.

(10) Patent No.: US 10,921,412 B2
(45) Date of Patent: Feb. 16, 2021

(54) INTENSITY CORRECTED MAGNETIC RESONANCE IMAGES

(71) Applicant: KONINKLIJKE PHILIPS N.V., Eindhoven (NL)

(72) Inventors: Fabian Wenzel, Hamburg (DE); Martin Bergtholdt, Hamburg (DE); Frank Olaf Thiele, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 57 days.

(21) Appl. No.: 16/461,428

(22) PCT Filed: Nov. 10, 2017

(86) PCT No.: PCT/EP2017/078833
§ 371 (c)(1),
(2) Date: May 16, 2019

(87) PCT Pub. No.: WO2018/091360
PCT Pub. Date: May 24, 2018

(65) Prior Publication Data
US 2019/0346526 A1 Nov. 14, 2019

(30) Foreign Application Priority Data
Nov. 17, 2016 (EP) ..................................... 16199279

(51) Int. Cl.
*G06K 9/00* (2006.01)
*G01R 33/565* (2006.01)
(Continued)

(52) U.S. Cl.
CPC ... *G01R 33/56572* (2013.01); *G01R 33/5659* (2013.01); *G06T 5/50* (2013.01);
(Continued)

(58) Field of Classification Search
CPC ................................................ G01R 33/56572
See application file for complete search history.

(56) References Cited

U.S. PATENT DOCUMENTS 7,432,707 B1 10/2008 Boitano
8,295,575 B2 10/2012 Feldman et al.
(Continued)

OTHER PUBLICATIONS

Adhikari et al (NPL "A nonparametric method for intensity inhomogeneity correction in MRI brain images by fusion of Gaussian surface", Aug. 26, 2013, DOI 10.1007/s11760-014-0689-5, p. 10). (Year: 2013).*

(Continued)

*Primary Examiner* — Oneal R Mistry (57) ABSTRACT

The invention provides for a medical instrument (100) comprising a processor (134) and a memory (138) containing machine executable instructions (140). Execution of the machine executable instructions causes the processor to: receive (200) a first magnetic resonance image data set (146) descriptive of a first region of interest (122) of a subject (118) and receive (202) at least one second magnetic resonance image data set (152, 152') descriptive of a second region of interest (124) of the subject. The first region of interest at least partially comprises the second region of interest. Execution of the machine executable instructions further cause the processor to receive (204) an analysis region (126) within both the first region of interest and within the second region of interest. Execution of the machine executable instructions further cause the processor to construct (206) a cost function comprising an intra-scan homogeneity measure separately for the first magnetic resonance image data set and separately for each of the at least one second magnetic resonance image data set. The cost function further comprises an inter-scan similarity measure calculated using both the first magnetic resonance image (Continued)

data set and each of the at least one second magnetic resonance image data set. Execution of the machine executable instructions further cause the processor to by performing an optimization (208) of the cost function by calculating a first intensity correction map (154) for the first magnetic resonance image data set using an intensity correction algorithm within the analysis region and at least one second intensity correction map (156) for each of the at least one second magnetic resonance image data set within the analysis region. Execution of the machine executable instructions further cause the processor to calculate (210) a first corrected magnetic resonance image (158) descriptive of the analysis region using the first magnetic resonance image data set and the first intensity correction map. Execution of the machine executable instructions further cause the processor to calculate (212) at least one second corrected magnetic resonance image (160) descriptive of the analysis region using the at least at least one second magnetic resonance image data set and the at least one second intensity correction map.

15 Claims, 3 Drawing Sheets

(51) Int. Cl.
*G06T 7/30* (2017.01)
*G06T 7/00* (2017.01)
*G06T 5/50* (2006.01)

(52) U.S. Cl.
CPC ............... *G06T 7/30* (2017.01); *G06T 7/97* (2017.01); *G06T 2207/10088* (2013.01)

(56) References Cited

U.S. PATENT DOCUMENTS

| | | | |
|---|---|---|---|
| 10,127,660 B2* | 11/2018 | Madabhushi | G06T 7/0012 |
| 10,247,802 B2 | 4/2019 | Wang et al. | |
| 2008/0292194 A1 | 11/2008 | Schmidt et al. | |
| 2013/0102879 A1* | 4/2013 | Maclaren | A61B 5/055 |
| | | | 600/411 |
| 2016/0314581 A1* | 10/2016 | Contini | A61B 5/026 |
| 2017/0243336 A1 | 8/2017 | Zou et al. | |

OTHER PUBLICATIONS

Stefan Klein and Marius Staring, Elastix the manual, Sep. 4, 2015 pp. 6 to 7 in chapter 2.3 Metrics.
Tustison et al "N4ITK: Improved N3 Bias Correction" IEEE Trans Med Imaging. Jun. 2010 ; 29(6): 1310-1320. doi:10.1109/TMI.2010.2046908.
Vovk et al "Intensity Inhomogeneity Correction of Multispectral MR Images" Neuroimage 32 (2006) p. 54-61.
Kim et al "Robust Multislice MR Data Processing Iterative Optimization of Bias Correction, Tissue Classification and Registration" Frontiers in Neuroinformatics, Nov. 18, 2013.
Belaroussi et al "Intensity Non-Uniformity Correction in MRI: Existing Methods and Their Validation" Medical Image Analysis 10 (2006) p. 234-246.
Fan et al "A Unified Variational Approach to Denoising and Bias Correction in MR" IPMI 2003 p. 148-159.
Tustison et al "N4ITK: Improved N3 Bias Correction" IEEE Transactions on Medical Imaging, vol. 29, No. 6 Jun. 2010 p. 1310-1320.
International Search Report dated Jan. 31, 2018.
Lewis et al "Correction of Differential Intensity Inhomogeneity in Longitudinal MR Images" Neuroimage, 23 (2004) p. 75-83.
Sled et al "A Nonparametric Method for Automatic Correction of Intensity Nonuniformity in MRI Data" IEEE Transactions on Medical Imaging vol. 17, No. 1 Feb. 1998 p. 87-97.

* cited by examiner

INTENSITY CORRECTED MAGNETIC RESONANCE IMAGES

CROSS REFERENCE TO RELATED APPLICATIONS

This application is a U.S. national phase application of International Application No. PCT/EP2017/078833 filed on Nov. 10, 2017, which claims the benefit of EP Application Serial No. 16199279.9 filed on Nov. 17, 2016 and is incorporated herein by reference.

FIELD OF THE INVENTION

The invention relates to magnetic resonance imaging, in particular to the correction of intensity inhomogeneities for a series of magnetic resonance images.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the BO field or the main magnetic field.

One method of spatially encoding is to use magnetic field gradient coils. Typically there are three coils which are used to generate three different gradient magnetic fields in three different orthogonal directions.

During an MRI scan, Radio Frequency (RF) pulses generated by one or more transmitter coils cause a called B1 field. Additionally applied gradient fields and the B1 field do cause perturbations to the effective local magnetic field. RF signals are then emitted by the nuclear spins and detected by one or more receiver coils. The receiver coils typically have a sensitivity which is spatially dependent. This spatial dependency is one factor which can lead to intensity inhomogeneities in magnetic resonance images. Spatially dependent intensity inhomogeneities are often referred to as bias field inhomogeneity (or simply bias field) or signal inhomogeneity. Bias field inhomogeneities can in particular cause difficulties when using automatic algorithms to segment or identify regions in magnetic resonance images.

A variety of techniques exist for bias field correction. For example International patent application WO 2016/042037 A1 discloses a method of bias correction and image registration. Each image including a bias in intensity within the image of unknown magnitude, is performed by: a) inputting a digital data set of a first image and a digital data set of a second image into a computer; b) calculating a deformation of said first image that transforms said first image into a transformed image that is an optimized approximation of said second image and c) simultaneously calculating and applying a bias correction which is applied to said first image and a bias correction which is applied to said transformed image such that each of the first image and the transformed image is individually corrected for bias therein. Generally, an average of the bias correction over the first image is equal and opposite to an average of the bias correction over said transformed image.

SUMMARY OF THE INVENTION

The invention provides for a medical instrument, a method, and a computer program product in the independent claims. Embodiments are given in the dependent claims.

Embodiments of the invention may provide a means for providing consistent bias field or signal intensity correction for a series of magnetic resonance images. Herein the series of images is referred to as a first magnetic resonance data set and at least one second magnetic resonance image data set. There is a first magnetic resonance image (the a first magnetic resonance data set) and one or more second magnetic resonance images (at least one second magnetic resonance image data set).

This signal intensity correction is performed as part of an optimization process. Embodiments may achieve this by optimizing a cost function. The cost function may comprise several different factors. For each image in the series there is a term which represents an intra-scan homogeneity measure. The intra-scan homogeneity measure is a measure of how uniform the intensity is within one image. The cost function also comprises additional terms which comprise an inter-scan similarity measure. The inter-scan similarity measure is an algorithm which compares the first magnetic resonance image with each of the second magnetic resonance images.

Examples of inter-scan similarity measures can for example be found in the manual for the software package elastix from the University of Utrecht in the Netherlands. See Stefan Klein and Marius Staring, Elastix the manual, Sep. 4, 2015 pages 6 to 7 in chapter 2.3 Metrics. This manual is available online at http://elastix.isi.uu.nl/doxygen/index-.html.

During the optimization, a standard intensity correction algorithm or bias field correction algorithm is applied to all of the images. The optimization of the cost function causes the intensity correction to be applied in a way that not only corrects intensity inhomogeneities within a single magnetic resonance image, but also make the intensity profile of the entire series of magnetic resonance images converge.

This may have huge advantages when performing so called longitudinal studies where a series of magnetic resonance images from different times are examined. Making the intensity profiles of the magnetic resonance images more uniform may also increases the ability of automatic algorithms to correctly segment or analyze the series of magnetic resonance images.

In one aspect the invention provides for a medical instrument comprising a processor and a memory. The memory contains machine-executable instructions for execution by the processor. Execution of the machine-executable instructions causes the processor to receive a first magnetic resonance image dataset descriptive of a first region of interest of a subject. The first magnetic resonance image dataset may be three-dimensional magnetic resonance data, a collection of two-dimensional slabs or slices of magnetic resonance image data and in some cases may also be a single slice of magnetic resonance image data. The first magnetic resonance image dataset may be data which may be rendered in a two-dimensional or three-dimensional format to illustrate or show the first region of interest of the subject.

The receiving of the first magnetic resonance image dataset may be performed in several different ways. In some instances the final reconstructed first magnetic resonance image dataset is received in image space. In other examples the first magnetic resonance image dataset may be received by receiving magnetic resonance data that is reconstructed into image space. In yet other instances the receiving of the first magnetic resonance image dataset may also be performed by controlling a magnetic resonance imaging system to acquire magnetic resonance data which is then reconstructed into image space resulting in the first magnetic resonance image dataset.

Execution of the machine-executable instructions further cause a processor to receive at least one second magnetic resonance image dataset descriptive of a second region of interest of the subject. The details describing how the first magnetic resonance image dataset can be received are also applicable to the at least one second magnetic resonance image dataset. The first region of interest at least partially comprises the second region of interest. The first magnetic resonance image dataset and each of the at least one second magnetic resonance image dataset may be acquired using the same magnetic resonance imaging system or using different magnetic resonance imaging systems.

When a subject is placed into a magnetic resonance imaging system the exact anatomical region or region of interest which is imaged may not be identical every single time. The second region of interest and the first region of interest may therefore not be completely identical. Also the subject may be in a slightly different position such that although the same anatomical region may be imaged the area or the positioning of the subject within the region of interest may be slightly different in each case.

Execution of the machine-executable instructions further causes the processor to receive an analysis region within both the first region of interest and within the second region of interest. The analysis region is essentially a region where the first region of interest and the second region of interest overlap. The analysis region is a common space to both regions of interest. The receiving of the analysis region may be received for example by a physician or other medical technologist indicating the region within each of the first magnetic resonance imaging dataset and the at least one second magnetic resonance imaging dataset. In other instances the receiving of the analysis region may be performed automatically by for example performing a registration between the first magnetic resonance image dataset and the at least one second magnetic resonance imaging dataset to indicate which portions of these datasets correspond to each other and how the data may overlap.

Execution of the machine-executable instructions further cause the processor to construct a cost function comprising an intra-scan homogeneity measure separately for the first magnetic resonance imaging dataset and separately for the at least one second magnetic resonance image dataset. The intra-scan homogeneity measure is an algorithm which measures the homogeneous contrast of an image. In magnetic resonance images there can be differences in the contrast across a magnetic resonance image that are not due to the physical characteristics of the subject but are due to for example the characteristics of the magnetic resonance imaging system itself, for example in the sensitivity of the radio-frequency coils. The intra-scan homogeneity measure is put in a cost function to indicate how uniform the homogeneity measure is and to try to quantify inhomogeneities within a magnetic resonance image itself.

The cost function further comprises an inter-scan similarity measure calculated both the first magnetic resonance image dataset and each of the at least one second magnetic resonance image dataset. The cost function further has the inter-scan similarity measure to compare the first magnetic resonance image dataset to each of the at least one second magnetic resonance image datasets. The cost function is therefore dependent upon not just the intra-scan homogeneity but also a comparison between the different images. In some instances the first magnetic resonance image dataset may be registered to the at least one second magnetic resonance image dataset. In this case the cost function could be used simply to remove inhomogeneities intensities across all of the magnetic resonance imaging datasets. In other cases the various magnetic resonance image datasets may not be registered to each other. The cost function as it compares the inter-scan similarity measure may also be used as part of a registration process between the various datasets.

Execution of the machine-executable instructions further cause a processor to perform an optimization of the cost function to calculate a first intensity correction map for the first magnetic resonance image dataset using an intensity correction algorithm within the analysis region and at least one second intensity correction map for each of the at least one second magnetic resonance imaging dataset within the analysis region. Various algorithms for calculating intensity correction maps for a magnetic resonance imaging system are known. For example there are various models which are used for the so called bias-field correction. A bias-field correction algorithm such as is used for B-splines, DCT coefficients, or polynomial fields are just several examples.

Execution of the machine-executable instructions further cause a processor to calculate a first corrected magnetic resonance image descriptive of the analysis region using the first magnetic resonance image dataset and the first intensity correction map. In this step the first intensity correction map is applied to the first corrected magnetic resonance image dataset and this may be used to produce a corrected first magnetic resonance image dataset or even to render the first corrected magnetic resonance image. Execution of the machine-executable instructions further cause the processor to calculate at least one second corrected magnetic resonance image descriptive of the analysis region using the at least one second magnetic resonance image dataset and the at least one second intensity correction map. The at least one second intensity correction map may be used to generate corrected magnetic resonance data or even to render corrected magnetic resonance images for the at least one second magnetic resonance image dataset.

The advantages of this embodiment may be that because more than one magnetic resonance image dataset is being compared for the same anatomical region of the subject, this additional information may lead to better correction of intensity inhomogeneities such as bias-field correction than if each individual image is examined alone. Additionally, because the first magnetic resonance image dataset and the at least one second magnetic resonance image dataset have been compared and optimized for inter-scan similarity these resulting magnetic resonance images may be better used for automatic comparison of anatomical features within a subject. For example if a tumor is being examined over multiple magnetic resonance examinations the matching contrast within the images may allow an automatic algorithm to identify the location and/or size of a tumor more uniformly within the resulting images.

In another embodiment the step of receiving an analysis region within both the first region of interest and within the second region of interest comprises receiving a registration between the first magnetic resonance image dataset and at least each of the at least one second magnetic resonance imaging dataset. This registration may in some cases be performed well enough to enable all of the image processing. In other examples this may be a preliminary registration which is then refined during the optimization of the cost function.

In another embodiment, the medical instrument comprises a first magnetic resonance imaging system. Execution of the machine-executable instructions further cause the processor to acquire the first magnetic resonance image dataset by controlling the first magnetic resonance imaging system. The step of receiving the first magnetic resonance image dataset may also comprise reconstructing data acquired from k-space into image space.

In another embodiment, the medical instrument further comprises a second magnetic resonance imaging system. Execution of the machine-executable instructions further cause a processor to acquire at least a portion of the at least one second magnetic resonance image dataset by controlling the second magnetic resonance imaging system. Again, the receiving of the second magnetic resonance image dataset may also comprise reconstructing the at least one second magnetic resonance image dataset from data that was acquired in k-space.

A further advantage of the embodiments may be that the optimization of the cost function more easily enables images acquired on different magnetic resonance imaging systems to be compared. Another advantage may be that the optimization of the cost function may enable magnetic resonance images acquired at different periods of time with the same magnetic resonance imaging system to be more easily compared. For example comparing magnetic resonance images acquired days, months or even years apart.

In another embodiment, execution of the machine-executable instructions further causes the processor to register each of the at least one second magnetic resonance image dataset to the first magnetic resonance image dataset during optimization of the cost function. In this embodiment instead of just having a term in the cost function between the first magnetic resonance imaging dataset and individual second magnetic resonance image datasets there are now terms between the individual second magnetic resonance image datasets. This may be beneficial as it may result in a better optimization of the cost function. This may however come with the cost of increasing computational costs.

In another embodiment, the registration of each of the at least one second magnetic resonance image data set to the first magnetic resonance image data set, by calculation of the first intensity correction map, and calculation of the at least one second intensity correction map are all performed as a joint optimization. For example, the registration can use the inter-scan similarity measure to perform a registration or a refinement of an existing registration. This may be beneficial because non-uniformity of the contrast within the magnetic resonance image datasets may cause errors in performing an initial registration. Performing a joint optimization may enable both better registration between images and better correction for the bias field inhomogeneity than could be possible if the two are performed separately.

In another embodiment, the inter-scan similarity measure comprises a term measuring similarity between the first magnetic resonance image dataset and each of the second magnetic resonance image dataset. The inter-scan similarity measure could be an algorithm that compares the corresponding voxels of the different magnetic resonance image datasets. This may be beneficial in assuring uniformity of the contrast of multiple images which are possibly acquired at different times and locations.

In another embodiment, the inter-scan similarity measure comprises a term measuring the similarity between each of the second magnetic resonance image dataset. In this example the inter-scan similarity measure is expanded to also include a comparison between the various second magnetic resonance image datasets. This may be beneficial in assuring that the images across all that have been acquired are more uniform.

In another embodiment, execution of the machine-executable instructions further cause the processor to perform a longitudinal analysis of the first corrected magnetic resonance image and the at least second corrected magnetic resonance image. A longitudinal analysis is when a series of magnetic resonance images is compared. This embodiment may be beneficial because the process of optimizing the cost function has made the various images more uniform with respect to each other. Automatic algorithms may perform more consistently on all the images.

In another embodiment, the intra-scan homogeneity measure is a measure of intensity homogeneity. Examples of a measure of intensity homogeneity may for example be such things as using histogram sharpening. Image intensities may for example be assumed to belong to mixed Gaussian distributions. The inhomogeneity may therefore be related to the standard deviation.

In another embodiment, the inter-scan homogeneity measure is a maximized mutual information algorithm. A maximized mutual information algorithm is a standard image processing algorithm used to compare two images or image datasets. This may be beneficial in comparing the multiple magnetic resonance image datasets.

In another embodiment, the first magnetic resonance image dataset and the at least one second magnetic resonance image dataset comprise magnetic resonance data acquired using different pulse sequence commands. For example the first magnetic resonance image dataset and the at least one second magnetic resonance image dataset may be acquired using different magnetic resonance imaging protocols. The use of for example the maximized mutual information algorithm may still enable the images to be compared effectively within a cost function even though the different images may have different inherent contrast characteristics.

In another embodiment, the inter-scan similarity measure comprises a voxel by voxel comparison using a sum of squared differences algorithm to compare intensities. In this embodiment, the various magnetic resonance datasets are compared voxel-by-voxel and a squared difference algorithm is used to compare them.

In another embodiment, the inter-scan similarity measure comprises a measure of image cross correlation. A cross correlation algorithm is a standard image processing technique which may be used for comparing different images.

In another embodiment, the intensity correction algorithm is any one of the following: a B-spline bias-field correction algorithm, a DCT coefficients bias-field correction algorithm, and a polynomial bias-field correction algorithm. The use of any of these or other standard intensity correction algorithms may be effectively used within the optimization of the cost function.

In another aspect, the invention provides for a method of medical imaging. The method comprises receiving a first magnetic resonance image dataset descriptive of a first region of interest of a subject. The method further comprises receiving at least one second magnetic resonance image dataset descriptive of a second region of interest of the subject. The first region of interest at least partially comprises the second region of interest. The method further comprises receiving an analysis region within both the first region of interest and within the second region of interest. The method further comprises constructing a cost function comprising an intra-scan homogeneity measure separately for the first magnetic resonance image dataset and separately each of the at least one second magnetic resonance image dataset. The cost function further comprises an inter-scan similarity measure calculated using both the first magnetic resonance image dataset and each of the at least one second magnetic resonance image dataset.

The method further comprises performing an optimization of the cost function to calculate a first intensity correction map for the first magnetic resonance image dataset using an intensity correction algorithm within the analysis region and at least one second intensity correction map for each of the at least one second magnetic resonance image dataset within the analysis region. The method further comprises calculating a first corrected magnetic resonance image descriptive of the analysis region using the first magnetic resonance image dataset and the first intensity correction map. The method further comprises calculating the at least one second corrected magnetic resonance image descriptive of the analysis region using the at least one second magnetic resonance image dataset and the at least one second intensity correction map.

In another embodiment, the method further comprises acquiring the first magnetic resonance image dataset with a first magnetic resonance imaging system.

In another embodiment, the method further comprises acquiring the at least one second magnetic resonance image dataset with a second magnetic resonance imaging system.

In another aspect, the invention provides for a computer program product comprising machine-executable instructions for execution by a processor controlling the medical instrument. Execution of the machine-executable instructions cause the processor to receive a first magnetic resonance image dataset descriptive of a first region of interest of a subject. Execution of the machine-executable instructions further cause the processor to receive the at least one second magnetic resonance image dataset descriptive of a second region of interest of the subject. The first region of interest at least partially comprises the second region of interest. Execution of the machine-executable instructions further cause the processor to receive an analysis region within both the first region of interest and within the second region of interest. Execution of the machine-executable instructions further cause the processor to construct a cost function comprising an intra-scan homogeneity measure separately for the first magnetic resonance image dataset and separately for each of the at least one second magnetic resonance image dataset.

The cost function further comprises an inter-scan similarity measure calculated using both the first magnetic resonance image dataset and each of the at least one second magnetic resonance image dataset. Execution of the machine-executable instructions further cause the processor to perform an optimization of the cost function to calculate a first intensity correction map for the first magnetic resonance image dataset using an intensity correction algorithm within the analysis region and at least one second intensity correction map for each of the at least one second magnetic resonance image dataset within the analysis region. Execution of the machine-executable instructions further cause the processor to calculate a first corrected magnetic resonance image descriptive of the analysis region using the first magnetic resonance image dataset and the first intensity correction map.

Execution of the machine-executable instructions further cause the processor to calculate the at least one second corrected magnetic resonance image descriptive of the analysis region using the at least one second magnetic resonance image dataset and the at least one second intensity correction map.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data. A magnetic resonance image comprises voxels. Voxels themselves represent an average of the magnetic resonance data for a defined volume. A two dimensional collection of voxels therefore resembles an image which is representative of a slice of the object being imaged. Two dimensional collections of voxels are therefore often referred to as a "slice."

A magnetic resonance image data set herein is understood to be a magnetic resonance image. The magnetic resonance image data set can be a three dimensional data set, a collection (or stack) of two dimensional slices, or a single two dimensional slice.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
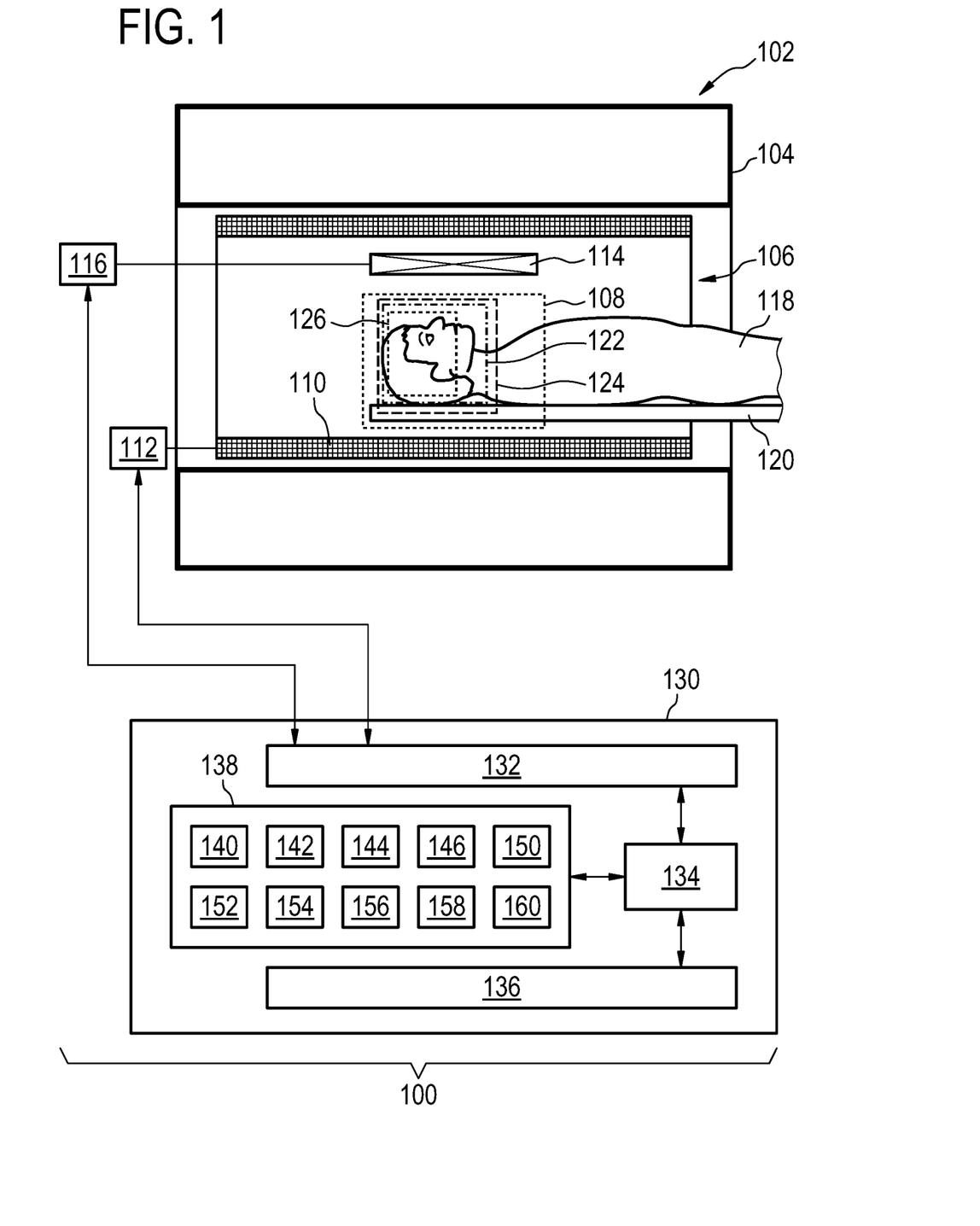
FIG. 1 illustrates an example of a medical imaging system.

FIG. 1 illustrates an example of a medical instrument 100. In this example the medical instrument comprises a magnetic resonance imaging system 102 and a computer system 130. In some examples, the medical instrument 100 only comprises the computer system 130 or an equivalent controller. The magnetic resonance imaging system 102 comprises a magnet 104. The magnet 104 is a superconducting cylindrical type magnet 104 with a bore 106 through it. The use of different types of magnets is also possible. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientation of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receiver. The radio-frequency coil 114 may also have multiple receive/transmit elements and the radio frequency transceiver 116 may have multiple receive/transmit channels.

Within the bore 106 of the magnet 104 there is a subject support 120 which supports the subject at least partially within in the imaging zone 108. Within the imaging zone 108 there can be seen a first region of interest 122 and a second region of interest 124. For example the subject 118 could be placed into the magnetic resonance imaging system 102 multiple times. It may be very difficult to image exactly the same location of the subject 118 every single time. The region marked 126 is an analysis region 126 that is within both the first region of interest 122 and the second region of interest 124. The analysis region 126 is a region in both regions of interest 122, 124 that will be corrected for inhomogeneities. In some examples the first region of interest 122 and the second region of interest 124 could overlap or be identical. For example a series of magnetic resonance images could be acquired from the subject 118 for a single examination.

In other examples, the first region of interest 122 and any subsequent second region of interest 124 may be located in different locations as was mentioned previously because the subject 118 has been inserted repeatedly into the magnetic resonance imaging system 102 at different times. In yet further examples the first region of interest 122 and subsequent second region of interest 124 could be within different magnetic resonance imaging systems altogether.

The transceiver 116 and the magnetic field gradient coil power supply 112 can be seen as being connected to a hardware interface 132 of computer system 130. The computer system further comprises a processor 134 that is in communication with the hardware interface 132, a memory 138, and a user interface 136. The memory 138 (also referred to as computer memory) may be any combination of memory which is accessible to the processor 134. This may include such things as main memory, cached memory, and also non-volatile memory such as flash RAM, hard drives, or other storage devices. In some examples the memory 134 may be considered to be a non-transitory computer-readable medium. The memory 134 is shown as storing machine-executable instructions 140 which enable the processor 132 to control the operation and function of the magnetic resonance imaging system 100.

The computer memory 138 is shown as containing machine-executable instructions 140 which enable the processor 134 to either control the magnetic resonance imaging system 102 and/or to perform image processing or data analysis. The computer memory 138 is further shown as containing pulse sequence commands 142 that enable the processor 134 to control the magnetic resonance imaging system to acquire magnetic resonance data from the first region of interest 122 and/or the second region of interest 124.

Pulse sequence commands as used herein encompass commands or a timing diagram which may be converted into commands which are used to control the functions of the magnetic resonance imaging system 102 as a function of time. Pulse sequence commands are the implementation of the magnetic resonance imaging protocol applied to a particular magnetic resonance imaging system 102.

The computer memory 138 is shown as containing first magnetic resonance data 144 that was acquired for the first region of interest 122 and second magnetic resonance data 150 that was acquired from the second region of interest 124. Both the first magnetic resonance data and the second magnetic resonance data 150 were acquired by controlling the magnetic resonance imaging system with the pulse sequence commands 142. The computer memory 138 is further shown as containing a first magnetic resonance image dataset 146 that was reconstructed from the first magnetic resonance data 144. The first magnetic resonance image dataset 146 may for example be a three-dimensional reconstruction of magnetic resonance image data from the first magnetic resonance data 144.

The computer memory 138 is further shown as containing a second magnetic resonance image dataset 152 that was reconstructed from the second magnetic resonance data 150. The machine-executable instructions 140 may contain an implementation of an optimization of a cost function. The optimization of the cost function may be used to calculate a first intensity correction map 154 for the first magnetic resonance image dataset 146 and a second intensity correction map 156 for the second magnetic resonance image dataset 152.

The computer memory 138 is further shown as containing a first corrected magnetic resonance image 158 that was calculated by applying the first intensity correction map 154 to the first magnetic resonance image dataset 146. The computer memory 138 is shown as further containing a second corrected magnetic resonance image 160 that was calculated by applying the second intensity correction map 156 to the second magnetic resonance image dataset 152. The magnetic resonance images 158 and 160 may for example be displayed on the user interface 136.

Figure 2:
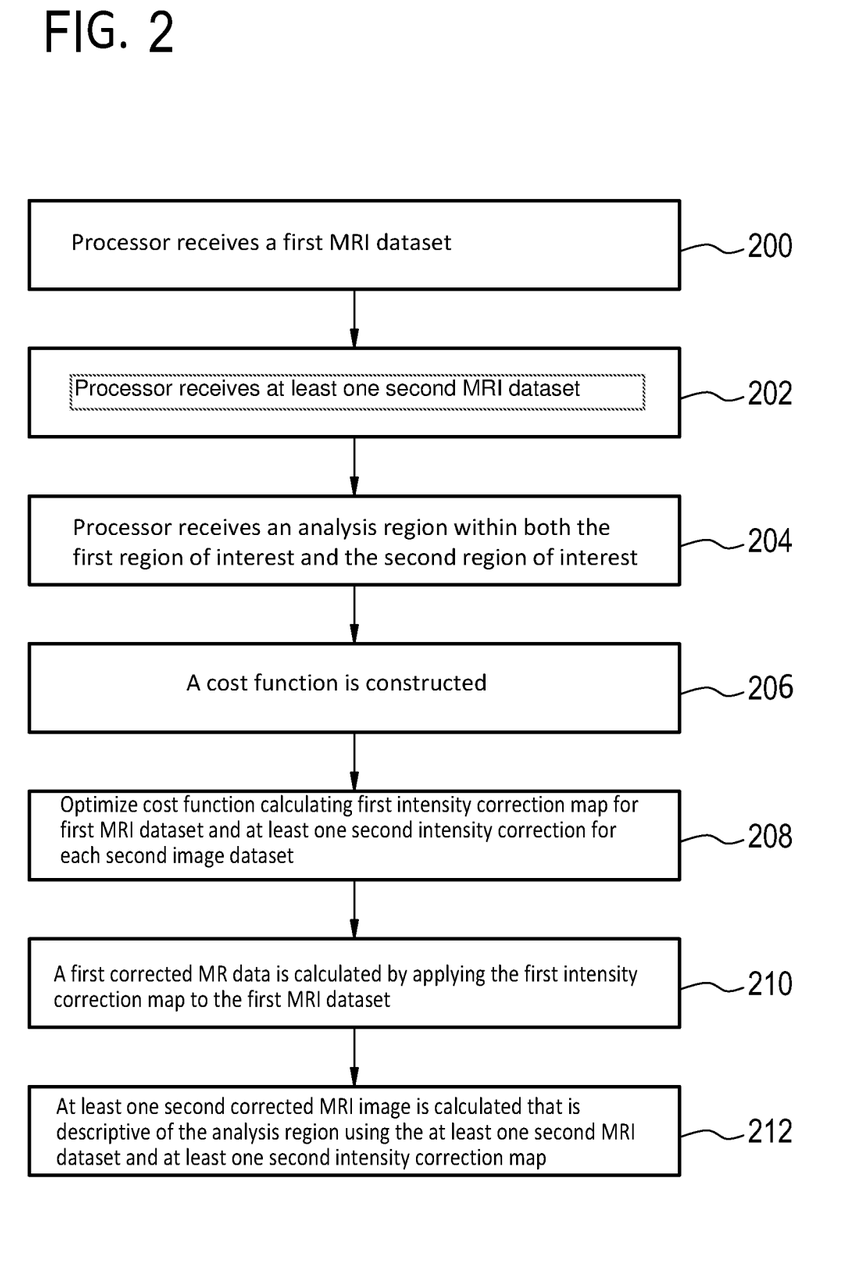
FIG. 2 shows a flow chart which illustrates a method of operating the medical imaging system of FIG. 1.

FIG. 2 shows a flowchart which illustrates a method of operating the medical imaging system 100 of FIG. 1. First in step 200, the processor 134 receives a first magnetic resonance image dataset 146. The first magnetic resonance image dataset 146 is descriptive of a first region of interest 122 of the subject 118. The receiving of the first magnetic resonance image dataset 146 may in some cases be the accessing of the first magnetic resonance image dataset 146 from the computer memory 138. In other examples the receiving of the first magnetic resonance image dataset may be the controlling of the magnetic resonance imaging system 102 to acquire the first magnetic resonance data 144 and then the reconstruction of the first magnetic resonance data 144 into the first magnetic resonance image dataset 146.

Next in step 202, the processor 134 receives at least one second magnetic resonance image dataset 152. The second magnetic resonance image dataset 152 is for a second region of interest 124. The receiving of the at least one second magnetic resonance image dataset 152 may in some cases be the accessing of the data in the computer memory 138. In other examples the receiving of the at least one second magnetic resonance image dataset 152 may involve the processor 134 controlling the magnetic resonance imaging system 102 to acquire the second magnetic resonance data 150 and then the reconstruction of the second magnetic resonance data 150 into the second magnetic resonance image dataset 152.

Next in step 204, the processor 134 receives an analysis region 126 within both the first region of interest 122 and the second region of interest 124. In some cases receiving the analysis region 204 may involve receiving data from the user interface 136. In other cases the receiving of the analysis region 126 may be performed automatically by a registration algorithm that registers the first magnetic resonance image dataset 146 to the at least one second magnetic resonance image dataset 152 and determines what data within the two image datasets overlaps and is in both datasets.

Next in step 206, a cost function is constructed. The cost function comprises an intra-scan homogeneity measure which is calculated separately for the first magnetic resonance image dataset and separately for each of the at least one second magnetic resonance image dataset 152. The cost function further comprises an inter-scan similarity measure calculated using both the first magnetic resonance image dataset and each of the at least one second magnetic resonance image dataset.

Next in step 208 the cost function is optimized by calculating a first intensity correction map 154 for the first magnetic resonance image dataset 146 and at least one second intensity correction map 156 for each of the at least one second magnetic resonance image dataset 152. Then in step 210 a first corrected magnetic resonance data 158 is calculated by applying the first intensity correction map 154 to the first magnetic resonance image dataset 146. In step 212 at least one second corrected magnetic resonance image 160 is calculated that is descriptive of the analysis region 160 using the at least one second magnetic resonance image dataset 152 and the at least one second intensity correction map 156.

Figure 3:
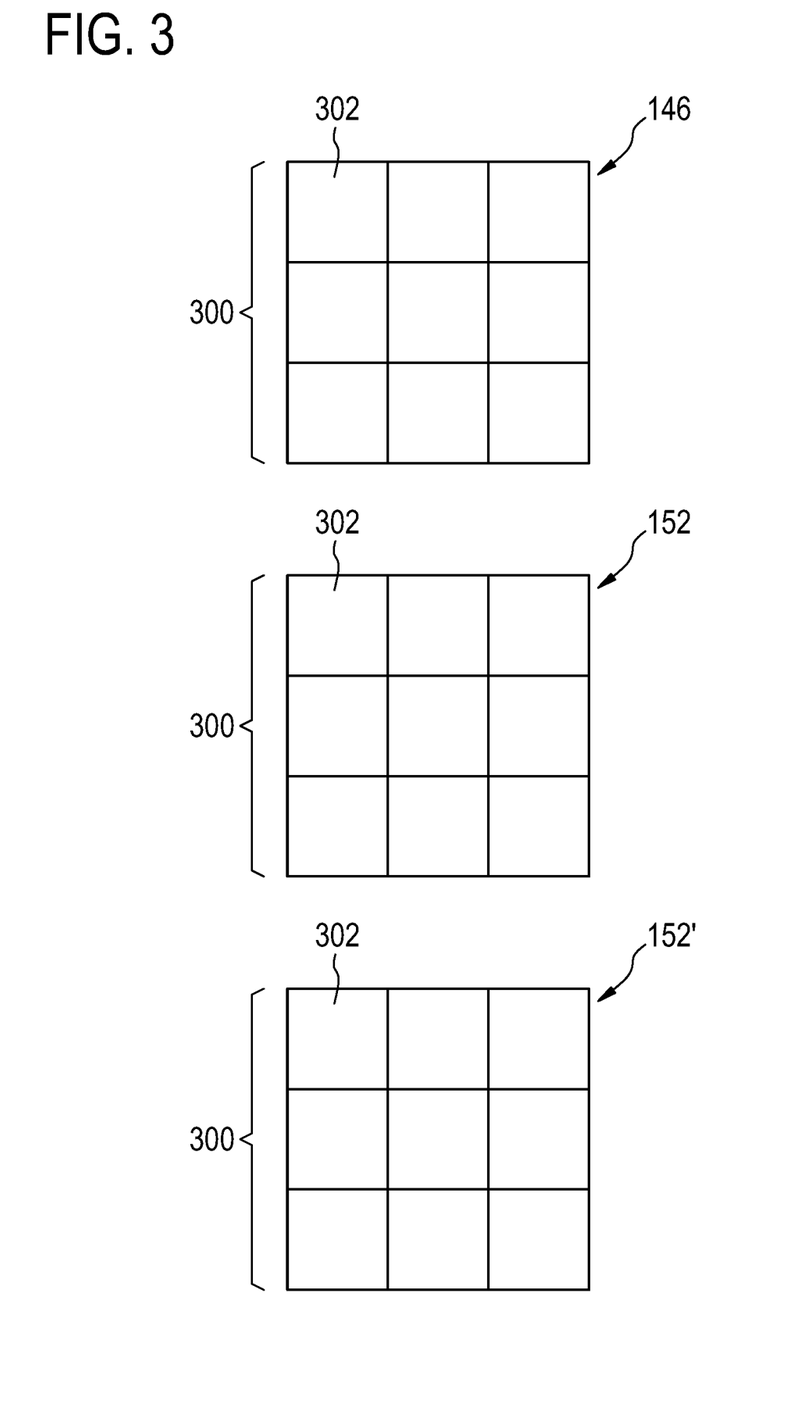
FIG. 3 shows several figures which are used to ideally represent a series of magnetic resonance images.

FIG. 3 shows three sets of squares which tend to ideally represent three different magnetic resonance image datasets. 152 and 152' represent two different second magnetic resonance image datasets. A difficulty when comparing different magnetic resonance images of the same subject is that there may be so called bias-fields which result in inhomogeneity intensities across the image. Particularly when the subject is placed into different magnetic resonance imaging systems or the same magnetic resonance imaging system at different points of time. It may be advantageous to perform a so called longitudinal analysis of the various images 146, 152, 152'. Inhomogeneities in the intensity however may prevent an automatic algorithm from functioning properly.

Examples may correct for this by performing an optimization of a cost function. The cost function may have a variety of different terms. There for example may be an intra-scan homogeneity measure which is used to measure the intra-scan homogeneity of the images 146, 152 and 152' separately. There may then be terms in the cost function which make comparisons between the different images 146, 152 and 152'. For example there may be an inter-scan similarity measure which compares image 146 and 152 and another term which compares image 146 and 152'. In some examples there may be additional terms which compare the second magnetic resonance image datasets 152 and 152' with each other. Depending upon the application each of these terms in the cost function may have different weightings. These for example may be determined empirically. The intra-scan homogeneity measure looks at the voxels 300 within a particular image 146, 152, 152'. The inter-scan similarity measure may compare voxels 302 which correspond to each other in the different images 146, 152, 152'.

Contrast in MRI may be widely affected by a bias-field, an artifact of the MR acquisition process, which leads to inhomogeneous intensities across the scan. Correction techniques exist, but they either require prior knowledge about the expected contrast, therefore limiting versatile applicability, or they are limited in terms of accuracy and robustness. This invention proposes a bias-field-correction technique for follow-up imaging which not only increases homogeneity of tissue-specific contrast in one scan but also increases the similarity of different registered scans acquired at different time points, enabling improved longitudinal assessment and quantification of brain scans. While a bias-field, to some extent, might be easily compensated by human perception during visual assessment, it generally affects quantitative analysis since it alters intensity values.

Examples may provide for a means of bias field correction that may be useful for follow-up imaging in which more than one scan of the same subject is available (a longitudinal study). Examples may exploits the fact that bias-field-corrected scans not only should yield more homogeneous spatial contrast per scan, but also should reveal consistent intensity distributions for different time points.

The main element of some examples may include the simultaneous estimation of the bias field of two or more scans of the same subject by a joint optimization of (i) homogeneous contrast per scan as well as (ii) a similar appearance of scans acquired at different time points. It can be applied as an extension to state-of-the-art techniques for bias-field correction techniques such that multiple scans at once can be corrected simultaneously.

Many approaches for bias-field-correction based on single images model the bias-field as a multiplicative low-frequency component, e.g. via b-splines with a limited number of control points, or via other approaches such as DCT coefficients or polynomial fields. The appearance of a bias-field is then optimized via modification of their defining parameters while maximizing intensity homogeneity. A widely used optimization criterion is histogram sharpening, in which image intensities are assumed to belong to mixed Gaussian distributions, while their standard deviation indicate their inhomogeneity. For example, see: Tustison, N. J., Avants, B. B., Cook, P. A., Zheng, Y., Egan, A., Yushkevich, P. A., Gee, J. C., 2010. N4ITK: improved N3 bias correction. IEEE Trans. Med. Imaging 29, 1310-1320. doi:10.1109/TMI.2010.2046908.

In the context of follow-up image quantification, the optimization criterion not only can include separate components for histogram sharpening for all longitudinal images but also the homogeneity of their voxel-wise difference. All components, i.e. intra-scan homogeneity constraints as well as inter-scan similarity constraints might be combined, for example via linear combination with generic, application-specific or custom weight factors.

For inter-subject similarity constraints, various optimization constraints from the application domain of image registration might be applicable, with a few examples given below:

For two images of the same MR acquisition sequence, inter-scan similarity constraint might be formulated as the cross-correlation of two images or the voxel-wise sum of squared differences between images.

For two images of a different MR acquisition sequence, inter-scan similarity constraint might be formulated as the maximized mutual information.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical instrument
102 magnetic resonance system
104 magnet
106 bore of magnet
108 imaging zone
110 magnetic field gradient coils
112 magnetic field gradient coil power supply
114 radio-frequency coil
116 transceiver
118 subject
120 subject support
122 first region of interest
124 second region of interest
126 analysis region
130 computer system
132 hardware interface
134 processor
136 user interface
138 computer memory
140 machine executable instructions
142 pulse sequence commands
144 first magnetic resonance data
146 first magnetic resonance image data set
150 second magnetic resonance data
152 second magnetic resonance image data set
152' second magnetic resonance image data set
154 first intensity correction map
156 second intensity correction map
158 first corrected magnetic resonance image
160 second corrected magnetic resonance image
300 voxels
302 voxel

The invention claimed is:

1. A medical instrument comprising a processor and a memory, wherein the memory contains machine executable instructions, wherein execution of the machine executable instructions causes the processor to:

receive a first magnetic resonance image data set descriptive of a first region of interest of a subject;
receive at least one second magnetic resonance image data set descriptive of a second region of interest of the subject, wherein the first region of interest at least partially comprises the second region of interest;
receive an analysis region within both the first region of interest and within the second region of interest;
construct a cost function comprising an intra-scan homogeneity measure separately for the first magnetic resonance image data set and separately for each of the at least one second magnetic resonance image data set, wherein the cost function further comprises an inter-scan similarity measure calculated using both the first magnetic resonance image data set and each of the at least one second magnetic resonance image data set;

by performing an optimization of the cost function by calculating a first intensity correction map for the first magnetic resonance image data set using an intensity correction algorithm within the analysis region and at least one second intensity correction map for each of the at least one second magnetic resonance image data set within the analysis region;

calculate a first corrected magnetic resonance image descriptive of the analysis region using the first magnetic resonance image data set and the first intensity correction map; and calculate at least one second corrected magnetic resonance image descriptive of the analysis region using the at least at least one second magnetic resonance image data set and the at least one second intensity correction map.

2. The medical instrument of claim 1, wherein the medical instrument comprises a first magnetic resonance imaging system, wherein execution of the machine executable instructions further causes the processor to acquire the first magnetic resonance image data set by controlling the first magnetic resonance imaging system.

3. The medical instrument of claim 2, wherein the medical instrument comprises a second magnetic resonance imaging system, wherein execution of the machine executable instructions further causes the processor to acquire at least a portion of the at least one second magnetic resonance image data set by controlling the second magnetic resonance imaging system.

4. The medical instrument of claim 1, wherein execution of the machine executable instructions further causes the processor to register each of the at least one second magnetic resonance image data set to the first magnetic resonance image data set during optimization of the cost function.

5. The medical instrument of claim 4, wherein registration of each of the at least one second magnetic resonance image data set to the first magnetic resonance image data set, calculation of the first intensity correction map, and calculation of the at least one second intensity correction map are all performed as a joint optimization.

6. The medical instrument of claim 1, wherein the inter-scan similarity measure comprises a term measuring similarity between the first magnetic resonance image data set and each of the second magnetic resonance image data set.

7. The medical instrument of claim 6, wherein the inter-scan similarity measure comprises a term measuring the similarity between each second magnetic resonance image data set.

8. The medical instrument of claim 1, wherein execution of the machine executable instructions further causes the processor to perform a longitudinal analysis of the first corrected magnetic resonance image and the at least second corrected magnetic resonance image.

9. The medical instrument of claim 1, wherein the inter-scan similarity measure is a maximized mutual information algorithm.

10. The medical instrument of claim 1, wherein the inter-scan similarity measure comprises a voxel wise sum of squared differences.

11. The medical instrument of claim 1, wherein the inter-scan similarity measure comprises a measure of image cross-correlation.

12. The medical instrument of claim 1, wherein the intensity correction algorithm is any one of the following: a b-splines bias field correction algorithm, a DCT coefficients bias field correction algorithm, and polynomial bias field correction algorithm.

13. A method of medical imaging, wherein the method comprises:

receiving a first magnetic resonance image data set descriptive of a first region of interest of a subject;

receiving at least one second magnetic resonance image data set descriptive of a second region of interest of the subject, wherein the first region of interest at least partially comprises the second region of interest;

receiving an analysis region within both the first region of interest and within the second region of interest;

constructing a cost function comprising an intra-scan homogeneity measure separately for the first magnetic resonance image data set and separately for each of the at least one second magnetic resonance image data set, wherein the cost function further comprises an inter-scan similarity measure calculated using both the first magnetic resonance image data set and each of the at least one second magnetic resonance image data set;

performing an optimization of the cost function by calculating a first intensity correction map for the first magnetic resonance image data set using an intensity correction algorithm within the analysis region and at least one second intensity correction map for each of the at least one second magnetic resonance image data set within the analysis region;

calculating a first corrected magnetic resonance image descriptive of the analysis region using the first magnetic resonance image data set and the first intensity correction map; and calculating at least one second corrected magnetic resonance image descriptive of the analysis region using the at least at least one second magnetic resonance image data set and the at least one second intensity correction map.

14. The method of claim 13, wherein the method comprises acquiring the first magnetic resonance image data set with a first magnetic resonance imaging system, and wherein the method comprises acquiring the second magnetic resonance image data set with a first magnetic resonance imaging system.

15. A computer program product comprising machine executable instructions stored on a non-transitory computer readable medium for execution by a processor controlling a medical instrument, wherein execution of the machine executable instructions causes the processor to:

receive a first magnetic resonance image data set descriptive of a first region of interest of a subject;

receive at least one second magnetic resonance image data set descriptive of a second region of interest of the subject, wherein the first region of interest at least partially comprises the second region of interest;

receive an analysis region within both the first region of interest and within the second region of interest;

construct a cost function comprising an intra-scan homogeneity measure separately for the first magnetic resonance image data set and separately for each of the at least one second magnetic resonance image data set, wherein the cost function further comprises an inter-scan similarity measure calculated using both the first magnetic resonance image data set and each of the at least one second magnetic resonance image data set;

by performing an optimization of the cost function by calculating a first intensity correction map for the first magnetic resonance image data set using an intensity correction algorithm within the analysis region and at least one second intensity correction map for each of the at least one second magnetic resonance image data set within the analysis region;

calculate a first corrected magnetic resonance image descriptive of the analysis region using the first magnetic resonance image data set and the first intensity correction map; and calculate at least one second corrected magnetic resonance image descriptive of the analysis region using the at least at least one second magnetic resonance image data set and the at least one second intensity correction map.

\* \* \* \* \*